(12) United States Patent
Nishizawa

(10) Patent No.: US 10,593,721 B2
(45) Date of Patent: Mar. 17, 2020

(54) SOLID-STATE IMAGING ELEMENT, METHOD OF MANUFACTURING THE SAME, AND IMAGING DEVICE

(71) Applicant: SONY SEMICONDUCTOR SOLUTIONS CORPORATION, Kanagawa (JP)

(72) Inventor: Kenichi Nishizawa, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 0 days.

(21) Appl. No.: 16/394,891

(22) Filed: Apr. 25, 2019

(65) Prior Publication Data

US 2019/0252452 A1 Aug. 15, 2019

Related U.S. Application Data

(63) Continuation of application No. 15/996,730, filed on Jun. 4, 2018, now Pat. No. 10,276,624, which is a
(Continued)

(30) Foreign Application Priority Data

Jun. 27, 2013 (JP) .................................. 2013-134838

(51) Int. Cl.
*H01L 27/146* (2006.01)
*H01L 31/0392* (2006.01)

(52) U.S. Cl.
CPC .. *H01L 27/14645* (2013.01); *H01L 27/14621* (2013.01); *H01L 27/14623* (2013.01);
(Continued)

(58) Field of Classification Search
CPC ......... H01L 31/03923; H01L 27/14687; H01L 27/14685; H01L 27/14645;
(Continued)

(56) References Cited

U.S. PATENT DOCUMENTS 4,672,221 A * 6/1987 Saito ................. H01L 27/14603
250/208.1
8,384,172 B2 * 2/2013 Lee .................... H01L 27/14627
257/432

(Continued)

FOREIGN PATENT DOCUMENTS

CN 102800685 A 11/2012
CN 103959467 A 7/2014
(Continued)

OTHER PUBLICATIONS

Notice of Allowance and Fees Due for U.S. Appl. No. 15/996,730, dated Dec. 20, 2018, 08 pages.
(Continued)

*Primary Examiner* — Earl N Taylor
(74) *Attorney, Agent, or Firm* — Chip Law Group

(57) ABSTRACT

In pixels that are two-dimensionally arranged in a matrix fashion in the pixel array unit of a solid-state imaging element, a photoelectric conversion film having a light shielding film buried therein is formed and stacked on the light incident side of the photodiode. The present technique can be applied to a CMOS image sensor compatible with the global shutter system, for example.

12 Claims, 8 Drawing Sheets

Related U.S. Application Data continuation of application No. 15/426,772, filed on Feb. 7, 2017, now Pat. No. 10,002,902, which is a continuation of application No. 14/891,541, filed as application No. PCT/JP2014/003291 on Jun. 19, 2014, now Pat. No. 9,590,003.

(52) U.S. Cl.
CPC .. *H01L 27/14627* (2013.01); *H01L 27/14632* (2013.01); *H01L 27/14685* (2013.01); *H01L 27/14687* (2013.01); *H01L 31/03923* (2013.01)

(58) Field of Classification Search
CPC ......... H01L 27/14632; H01L 27/14627; H01L 27/14621
See application file for complete search history.

(56) References Cited

U.S. PATENT DOCUMENTS

| | | | | |
|---|---|---|---|---|
| 8,445,985 | B2* | 5/2013 | Hiyama | H01L 27/14623 257/435 |
| 8,704,324 | B2* | 4/2014 | Hiyama | H01L 27/14623 257/435 |
| 8,917,338 | B2* | 12/2014 | Otsuka | H01L 27/14621 257/447 |
| 8,928,784 | B2* | 1/2015 | Watanabe | H01L 31/18 348/272 |
| 8,964,081 | B2* | 2/2015 | Ohkubo | H01L 27/14623 348/308 |
| 9,105,539 | B2* | 8/2015 | Miyanami | H01L 27/14623 |
| 9,111,833 | B2* | 8/2015 | Kitamura | H01L 27/14623 |
| 9,219,092 | B2* | 12/2015 | Jangjian | H01L 27/14632 |
| 9,276,032 | B2* | 3/2016 | Suzuki | H01L 27/1463 |
| 9,281,333 | B2* | 3/2016 | Lin | H01L 27/14603 |
| 9,288,380 | B2* | 3/2016 | Nomura | H04N 5/23212 |
| 9,349,766 | B2* | 5/2016 | Sugiura | H01L 27/14621 |
| 9,515,110 | B2* | 12/2016 | Kambe | H01L 27/14603 |
| 9,590,003 | B2* | 3/2017 | Nishizawa | H01L 27/14685 |
| 10,002,902 | B2* | 6/2018 | Nishizawa | H01L 27/14685 |
| 2006/0181629 | A1* | 8/2006 | Miyashita | H01L 27/14623 348/311 |
| 2008/0087800 | A1* | 4/2008 | Toda | H01L 27/14603 250/214 C |
| 2008/0297634 | A1* | 12/2008 | Uya | H01L 27/14623 348/294 |
| 2010/0078745 | A1* | 4/2010 | Wano | H01L 27/14685 257/432 |
| 2010/0171191 | A1 | 7/2010 | Lee | |
| 2010/0182471 | A1* | 7/2010 | Toda | H01L 27/14645 348/294 |
| 2010/0201834 | A1* | 8/2010 | Maruyama | H01L 31/18 348/222.1 |
| 2011/0037883 | A1* | 2/2011 | Lee | H01L 27/14623 348/273 |
| 2011/0109776 | A1* | 5/2011 | Kawai | H01L 27/14625 348/273 |
| 2011/0216212 | A1* | 9/2011 | Watanabe | H04N 5/2353 348/222.1 |
| 2011/0310282 | A1* | 12/2011 | Toda | H01L 27/14632 348/308 |
| 2012/0008024 | A1* | 1/2012 | Takimoto | H01L 27/1464 348/294 |
| 2012/0025059 | A1* | 2/2012 | Kawashima | H01L 27/14623 250/208.1 |
| 2012/0217602 | A1* | 8/2012 | Enomoto | H01L 27/14614 257/432 |
| 2013/0020663 | A1* | 1/2013 | Takimoto | H01L 27/14645 257/431 |
| 2014/0110809 | A1* | 4/2014 | Kitamura | H01L 27/14623 257/435 |
| 2014/0184810 | A1* | 7/2014 | Sekiguchi | H01L 27/1461 348/164 |
| 2014/0347538 | A1* | 11/2014 | Toda | H01L 27/14603 348/308 |
| 2015/0028442 | A1* | 1/2015 | Miyanami | H01L 27/14623 257/435 |
| 2015/0076484 | A1* | 3/2015 | Moriyama | H01L 27/14665 257/40 |
| 2015/0108598 | A1* | 4/2015 | Kambe | H01L 27/14603 257/432 |
| 2015/0171145 | A1* | 6/2015 | Park | H04N 5/3696 250/208.1 |
| 2015/0228693 | A1* | 8/2015 | Toda | H01L 27/14612 257/40 |
| 2015/0325614 | A1* | 11/2015 | Kitamura | H01L 27/14623 257/435 |
| 2016/0050359 | A1* | 2/2016 | Nakata | H01L 27/14621 250/201.2 |
| 2016/0093659 | A1* | 3/2016 | Nakamura | H01L 27/14614 250/208.1 |
| 2016/0126276 | A1* | 5/2016 | Nishizawa | H01L 27/14685 257/435 |
| 2016/0231468 | A1* | 8/2016 | Ootsuka | G02B 3/0018 |
| 2017/0148840 | A1* | 5/2017 | Nishizawa | H01L 27/14685 |

FOREIGN PATENT DOCUMENTS

| | | | | |
|---|---|---|---|---|
| JP | 62-104163 A | | 5/1987 | |
| JP | 62104163 A | * | 5/1987 | |
| JP | 02-140976 A | | 5/1990 | |
| JP | 02140976 A | * | 5/1990 | |
| JP | 2011-216970 A | | 10/2011 | |
| JP | 2012-064822 A | | 3/2012 | |
| JP | 2012064822 A | * | 3/2012 | ....... H01L 27/14603 |
| JP | 2012-248679 A | | 12/2012 | |
| JP | 2013-026332 A | | 2/2013 | |
| JP | 2013026332 A | * | 2/2013 | ....... H01L 27/14645 |
| TW | 201330238 A | | 7/2013 | |
| WO | 2013/031537 A1 | | 3/2013 | |
| WO | 2013/088983 A1 | | 6/2013 | |
| WO | WO-2013088983 A1 | * | 6/2013 | ....... H01L 27/14603 |
| WO | 2014/002361 A1 | | 1/2014 | |
| WO | WO-2014002361 A1 | * | 1/2014 | ............. H04N 5/363 |

OTHER PUBLICATIONS

Non-Final Rejection for U.S. Appl. No. 15/996,730, dated Aug. 9, 2018, 13 pages.

Office Action for CN Patent Application No. 201480034952.3, dated Feb. 14, 2018, 05 pages of Office Action and 08 pages of English Translation.

Non-Final Office Action for U.S. Appl. No. 14/891,541, dated Jul. 18, 2016, 14 pages.

Notice of Allowance for U.S. Appl. No. 14/891,541, dated Nov. 3, 2016, 07 pages.

Notice of Allowance for U.S. Appl. No. 14/891,541, dated Dec. 8, 2016, 04 pages.

Non-Final Office Action for U.S. Appl. No. 15/426,772, dated Jun. 15, 2017, 14 pages.

Notice of Allowance for U.S. Appl. No. 15/426,772, dated Oct. 16, 2017, 07 pages.

Notice of Allowance for U.S. Appl. No. 15/426,772, dated Feb. 23, 2018, 14 pages.

Notice of Allowance for U.S. Appl. No. 15/426,772, dated May 7, 2018, 02 pages.

International Search Report and Written Opinion of PCT Application No. PCT/JP2014/003291, dated Sep. 30, 2014, 11 pages of ISRWO.

International Preliminary Report on Patentability of PCT Application No. PCT/JP2014/003291, dated Jan. 7, 2016, 09 pages of IPRP.

* cited by examiner

SOLID-STATE IMAGING ELEMENT, METHOD OF MANUFACTURING THE SAME, AND IMAGING DEVICE

CROSS-REFERENCE PARAGRAPH

The present application is a continuation application of U.S. patent application Ser. No. 15/996,730, filed Jun. 4, 2018, which is a continuation application of U.S. patent application Ser. No. 15/426,772, filed Feb. 7, 2017, now U.S. Pat. No. 10,002,902, which is a continuation application of U.S. patent application Ser. No. 14/891,541 filed Nov. 16, 2015, now U.S. Pat. No. 9,590,003, which is a National Phase Patent Application of International Application No. PCT/JP2014/003291 filed Jun. 19, 2014 and which claims priority from Japanese Patent Application No. JP 2013-134838 filed Jun. 27, 2013. Each of the above referenced applications is hereby incorporated by reference in its entirety.

TECHNICAL FIELD

The present technique relates to solid-state imaging elements, methods of manufacturing the solid-state imaging elements, and imaging devices, and more particularly, relates to a solid-state imaging element that includes a photoelectric conversion film that can have a reduced thickness, a method of manufacturing the solid-state imaging element, and an imaging device.

BACKGROUND ART

Solid-state imaging elements such as CMOS (Complementary Metal Oxide Semiconductor) image sensors have been widely used in digital still cameras and digital video cameras.

As an electron shutter system for CMOS image sensors, a global shutter system has been suggested (see Patent Document 1, for example). According to the global shutter system, exposure is simultaneously started for all the valid pixels for imaging, and the exposure is simultaneously ended for all the valid pixels. Therefore, to temporarily store photoelectric charges accumulated by photodiodes while reading occurs after the end of the exposure, a memory unit needs to be provided.

In this type of CMOS image sensor, a light shielding film having light shielding properties needs to be formed to shield the memory unit from light. For example, Patent Document 2 discloses a CMOS image sensor that includes a light shielding film having light shielding properties.

CITATION LIST

Patent Documents

Patent Document 1: JP 2011-216970 A
Patent Document 2: JP 2012-248679 A

SUMMARY OF THE INVENTION

Problems to be Solved by the Invention

Where a structure in which a photoelectric conversion film that serves as a photoelectric converter and has light shielding properties is stacked on a semiconductor substrate is used as a CMOS image sensor that uses the global shutter system, a memory unit and transistors need to be formed on the semiconductor substrate, and the photoelectric conversion film to be stacked on the semiconductor substrate needs to maintain light shielding properties. To improve the light shielding properties, an increase in the thickness of the photoelectric conversion film is effective.

However, to perform light shielding in a complete manner, a thickness of 1 jam or greater is required, and a greater thickness leads to an increase in the load on film formation and processing procedures. A greater thickness also leads to an increase in semiconductor chip size. Therefore, with incorporation into end products being taken into account, a reduction in the thickness of the photoelectric conversion film is desired.

Also, according to the technique disclosed in Patent Document 2, the photoelectric conversion film is not stacked on a semiconductor substrate. Therefore, this technique is not suitable for a structure in which the photoelectric converter and the memory unit are stacked so as to reduce the semiconductor chip area.

The present technique has been developed in view of those circumstances, and aims to reduce the thickness of a photoelectric conversion film that serves as a photoelectric converter and has light shielding properties when a structure in which such a photoelectric conversion film is stacked on a semiconductor substrate is used.

Solutions to Problems

A solid-state imaging element of a first aspect of the present technique includes: a photodiode; and a photoelectric conversion film stacked on the light incident side of the photodiode, and a light shielding film being buried in the photoelectric conversion film.

The solid-state imaging element further includes a memory unit that stores charges transferred from the photodiode and is located immediately below the light shielding film.

The light shielding film may be formed in accordance with the pixel size.

The photoelectric conversion film may be an inorganic compound semiconductor that can be epitaxially grown.

The photoelectric conversion film may be a CIGS (Copper Indium Gallium DiSelenide) thin film.

In the solid-state imaging element of the first aspect of the present technique, a photoelectric conversion film having a light shielding film buried therein is stacked on the light incident side of a photodiode.

A manufacturing method of a second aspect of the present technique includes the steps of: forming a photodiode on a semiconductor substrate; and forming a photoelectric conversion film on the light incident side of the semiconductor substrate, and a light shielding film buried in the photoelectric conversion film.

In the manufacturing method of the second aspect of the present technique, a photodiode is formed on a semiconductor substrate, and a photoelectric conversion film having a light shielding film buried therein is formed on the light incident side of the semiconductor substrate.

An imaging device of a third aspect of the present technique has a solid-state imaging element mounted therein, the solid-state imaging element including: a photodiode; and a photoelectric conversion film stacked on the light incident side of the photodiode, and a light shielding film buried in the photoelectric conversion film.

In the imaging device of the third aspect of the present technique, a solid-state imaging element having a photoelectric conversion film stacked on the light incident side of a photodiode is mounted, with a light shielding film being buried in the photoelectric conversion film.

Effects of the Invention

According to the first through third aspects of the present technique, the thickness of the photoelectric conversion film can be reduced.

MODES FOR CARRYING OUT THE INVENTION

The following is a description of embodiments of the present technique, with reference to the drawings.

<Example Structure of a Solid-State Imaging Element>

Figure 1:
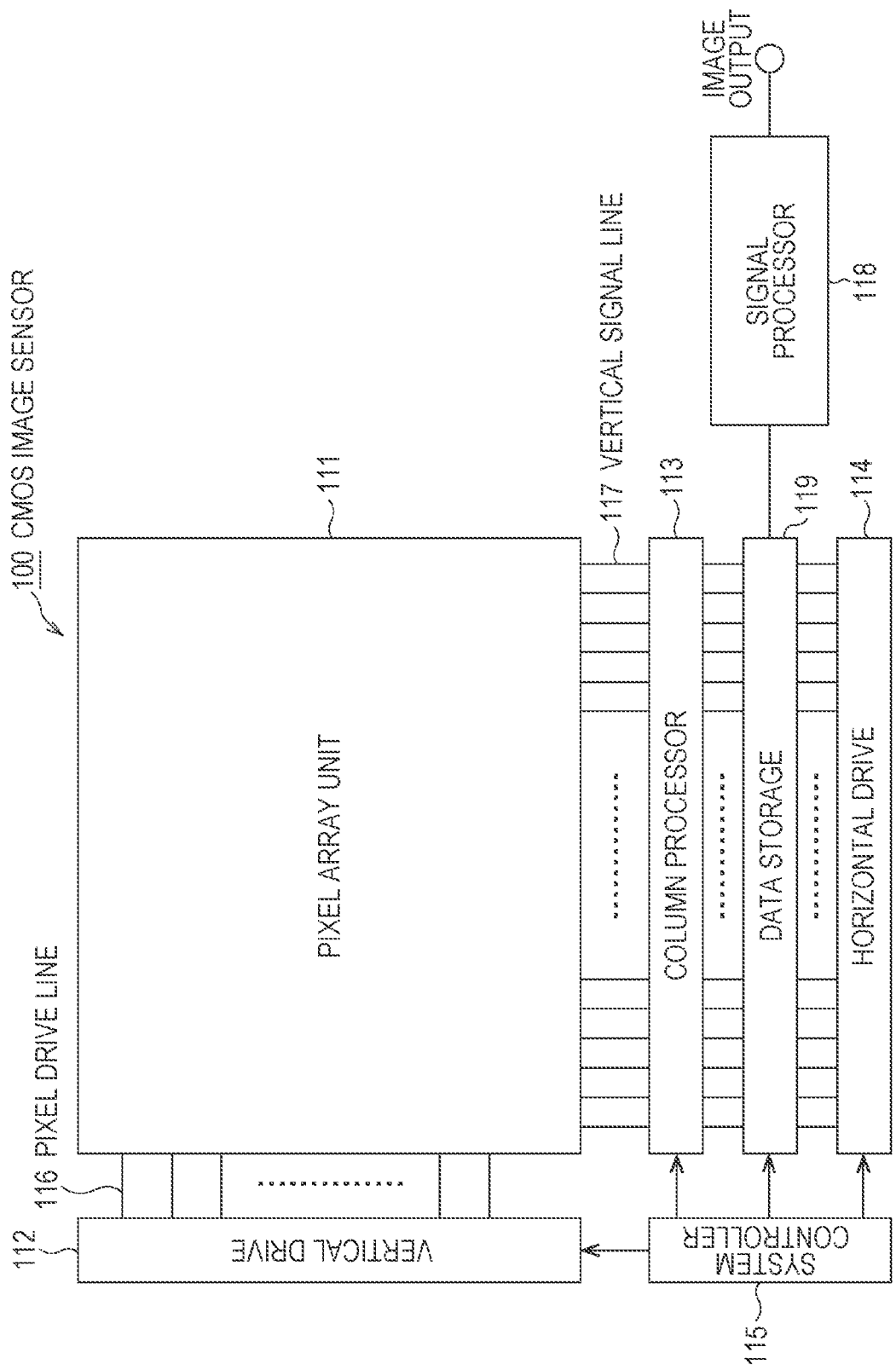
FIG. 1 is a diagram showing an example structure of a CMOS image sensor.

FIG. 1 is a block diagram showing an example structure of a CMOS image sensor as a solid-state imaging element to which the present technique is applied.

As shown in FIG. 1, the CMOS image sensor 100 includes a pixel array unit 111 and a peripheral circuit unit. The peripheral circuit unit includes a vertical drive 112, a column processor 113, a horizontal drive 114, and a system controller 115.

The CMOS image sensor 100 further includes a signal processor 118 and a data storage 119. The signal processor 118 and the data storage 119 may be mounted on the substrate on which the CMOS image sensor 100 is mounted, or may be an external signal processor provided on a substrate different from the substrate of the CMOS image sensor 100, such as a DSP (Digital Signal Processor) or a processor formed with software.

In the pixel array unit 111, unit pixels (hereinafter sometimes also referred to simply as "pixels") including photoelectric conversion elements are two-dimensionally arranged in a matrix fashion. The structure of each of the unit pixels will be described later in detail.

The pixel array unit 111 further has pixel drive lines 116 formed in the horizontal direction in the drawing for the respective rows in the matrix-like pixel arrangement, and has vertical signal lines 117 formed for the respective columns in the vertical direction in the drawing. One end of each of the pixel drive lines 116 is connected to the output end corresponding to the respective rows of the vertical drive 112.

The vertical drive 112 is a pixel drive unit that is formed with a shift register, an address decoder, and the like, and drives the respective pixels of the pixel array unit 111 all at once or row by row.

Signals that are output from the respective unit pixels of a pixel row selected and scanned by the vertical drive 112 are supplied to the column processor 113 through the respective vertical signal lines 117. For the respective pixel columns of the pixel array unit 111, the column processor 113 performs predetermined signal processing on the signals that are output from the respective unit pixels of the selected row through the vertical signal lines 117, and temporarily stores the pixel signals subjected to the signal processing.

Specifically, the column processor 113 performs a noise removal process such as a CDS (Correlated Double Sampling) process as the signal processing. Through the CDS process performed by the column processor 113, fixed pattern noise unique to the pixels, such as reset noise or variations in the threshold value of the amplification transistor, is removed. Other than performing the noise removal process, the column processor 113 can have an A-D (Analog-Digital) conversion function, for example, and output a signal level in the form of a digital signal.

The horizontal drive 114 is formed with a shift register, an address decoder, and the like, and sequentially selects the unit circuits corresponding to the pixel columns of the column processor 113. As the horizontal drive 114 performs selecting and scanning, the pixel signals subjected to the signal processing by the column processor 113 are sequentially output.

The system controller 115 is formed with a timing generator that generates various kinds of timing signals and the like, and controls driving of the vertical drive 112, the column processor 113, the horizontal drive 114, the data storage 119, and the like based on the various kinds of timing signals generated by the timing generator.

The signal processor 118 has at least an adding process function, and performs various kinds of signal processing such as an adding process on pixel signals that are output from the column processor 113. At the time of the signal processing performed by the signal processor 118, the data storage 119 temporarily stores the necessary data for the signal processing.

<Structures of Unit Pixels>

Figure 2:
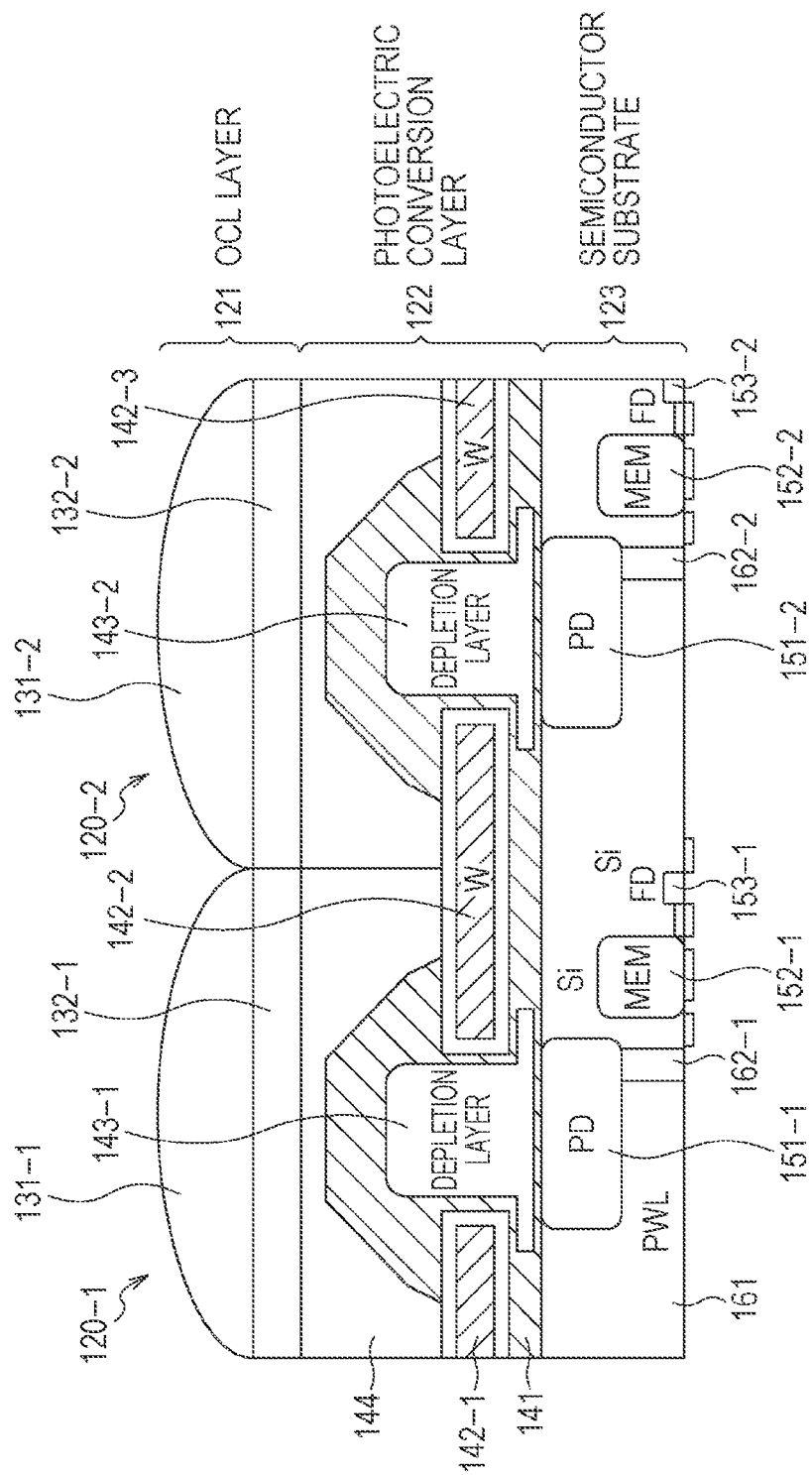
FIG. 2 is a cross-sectional view of an example structure of unit pixels.

Referring now to FIG. 2, the structures of the unit pixels 120 arranged in a matrix fashion in the pixel array unit 111 shown in FIG. 1 is described in detail.

FIG. 2 shows a cross-section of portions in the vicinities of unit pixels 120-1 and 120-2 adjacent to each other among the unit pixels 120 arranged in a matrix fashion. It should be noted that, in the following description, the unit pixel 120-1 and the unit pixel 120-2 will be referred to simply as the unit pixels 120 when there is no need to distinguish those unit pixels from each other.

The unit pixels 120 are formed by stacking an OCL (On Chip Lens) layer 121, a photoelectric conversion layer 122, and a semiconductor substrate 123 in this order from the top of the drawing.

In the OCL layer 121, small lenses 131 and color filters 132 are arranged for the respective unit pixels 120. In FIG. 2, a lens 131-1 and a color filter 132-1 for the unit pixel 120-1, and a lens 131-2 and a color filter 132-2 for the unit pixel 120-2 are shown.

In the photoelectric conversion layer 122, a photoelectric conversion film 141 is formed. In the photoelectric conversion film 141, a CIGS (Copper Indium Gallium DiSelenide) compound such as CuInGaS2 is used as a film material.

Here, a film seed having higher light absorptivity than silicon (Si) is used as the photoelectric conversion film 141, so that the thickness can be made smaller than that in a case where silicon is used.

As the film seed of the photoelectric conversion film 141, a compound semiconductor other than the above mentioned CuInGaS2 may be used, as long as it is an inorganic compound semiconductor that can be epitaxially grown.

Other than CuInGaS, CuInGaSe, and AgInGaSe2, it is possible to use a compound semiconductor formed with more than one element, such as gallium arsenide (GaAs), indium phosphide (InP), iron disulfide (FeS2), copper sulfide (Cu2S), tin sulfide (SnS2), barium silicide (BaSi2), gallium phosphide (GaP), or indium gallium phosphorus (InGaP).

As shown in FIG. 2, light shielding films 142-1 through 142-3 are buried in the photoelectric conversion film 141. In the light shielding films 142-1 through 142-3, tungsten (W) is used as the film material. The width of each opening formed between the light shielding films 142-1 and 142-2 and between the light shielding films 142-2 and 142-3 depends on the size of the unit pixels 120.

A negative potential is applied to the light shielding films 142-1 through 142-3, so that the p-type regions of the photoelectric conversion film 141 located on and under the edges of the respective openings are linked. Since the photoelectric conversion film 141 is of the p-type, depletion layers 143-1 and 143-2 are formed in the center regions of the respective openings when a negative potential is applied to the light shielding films 142-1 through 142-3. A planarizing film 144 is formed on the side on which light enters the photoelectric conversion layer 122.

In the description below, the light shielding films 142-1 through 142-3 will be referred to simply as the light shielding films 142 when there is no particular need to distinguish those films from one another.

The semiconductor substrate 123 is a light receiving layer that receives incident light emitted onto the CMOS image sensor 100, and has a p-type silicon layer (hereinafter referred to as the "p-type well layer (PWL)") 161 in which photodiodes are arranged for the respective unit pixels 120, for example.

The unit pixel 120-1 includes a photodiode (PD) 151-1. The photodiode 151-1 is a buried photodiode that is formed by forming a p-type layer on the substrate surface of the p-type well layer 161 formed on an n-type substrate and burying an n-type buried layer, for example.

The unit pixel 120-1 includes a memory unit (MEM) 152-1 and a floating diffusion region (FD) 153-1, as well as the photodiode 151-1.

The memory unit 152-1 is formed with an n-type buried channel having such an impurity density that a depletion state is formed at the time of discharging, and holds charges transferred from the photodiode 151-1. Also, located immediately below the light shielding film 142-2, as shown in FIG. 2, the memory unit 152-1 is shielded from light by the light shielding film 142-2.

The floating diffusion region 153-1 is a charge-voltage converter formed with an n-type layer having an impurity density, and converts charges transferred from the memory unit 152-1 into a voltage.

The unit pixel 120-2 includes a photodiode (PD) 151-2, a memory unit (MEM) 152-2, and a floating diffusion region (FD) 153-2. The structure of the unit pixel 120-2 is the same as the above described structure of the unit pixel 120-1, and therefore, explanation of it is not repeated herein. Located immediately below the light shielding film 142-3, the memory unit 152-2 is shielded from light by the light shielding film 142-3.

Figure 3:
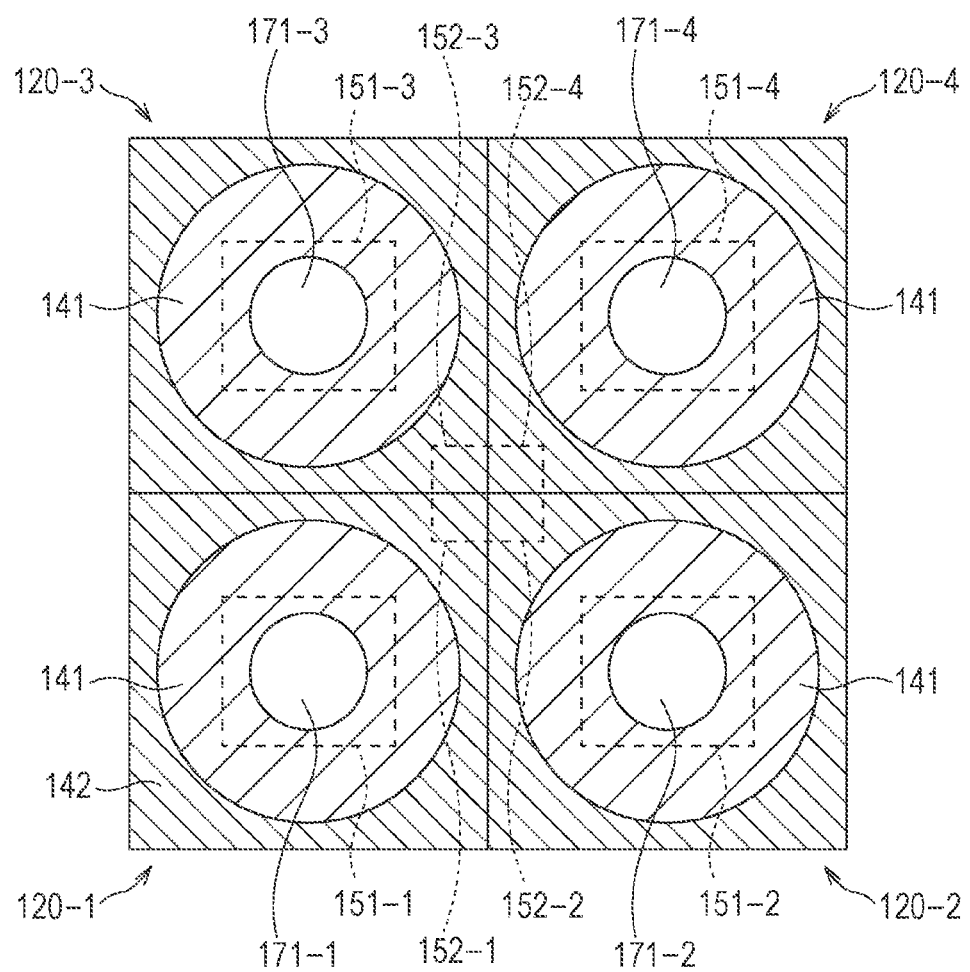
FIG. 3 is a top view of the example structure of unit pixels.

FIG. 3 is a top view corresponding to the cross-sectional view of the unit pixels 120 in FIG. 2. In FIG. 3, however, one square is equivalent to one unit pixel 120, and four adjacent unit pixels 120-1 through 120-4 are shown, for ease of explanation.

As shown in FIG. 3, in the unit pixel 120-1, the portions other than an opening 171-1 that guides light into the photodiode 151-1 and part of the photoelectric conversion film 141 are shielded from light by the light shielding film 142 buried in the photoelectric conversion film 141. That is, the memory unit 152-1 located at the upper right corner of the unit pixel 120-1 is located immediately below the light shielding film 142 and is shielded from light.

In the unit pixels 120-2 through 120-4, the memory units 152-2 through 152-4 are shielded from light by the light shielding films 142 buried in the photoelectric conversion film 141, as in the unit pixel 120-1.

In the example case shown in FIG. 3, the memory units 152-1 through 152-4 are located near the center position among the four unit pixels 120-1 through 120-4 and immediately below the light shielding films 142. However, the arrangement of the memory units 152 is not limited to that, and the memory units 152 may be located in other positions, as long as they are immediately below the light shielding films 142.

Two adjacent unit pixels 120 have been described with reference to FIG. 2, and four adjacent unit pixels 120 have been described with reference to FIG. 3. However, the other unit pixels 120 arranged in a matrix fashion in the pixel array unit 111 shown in FIG. 1 each have the same structure as above.

In the pixel array unit 111 shown in FIG. 1, one pixel is formed with a photodiode 151 and pixel transistors, and pixels are arranged in a matrix fashion. The pixel transistors are elements that transfer charges from the photodiode 151, and read the charges as signals. The pixel transistors are formed with transfer transistors, a reset transistor, an amplification transistor, and a select transistor, for example.

The transfer transistors are formed with a first transfer transistor that transfers charges accumulated in the photodiode 151 to the memory unit 152, and a second transistor that transfers the charges stored in the memory unit 152 to the floating diffusion region 153, for example. As shown in FIG. 2, first transfer transistors 162-1 and 162-2 are formed as vertical structures that extend in the depth direction from the surface of the semiconductor substrate 123.

The reset transistor is connected between a power supply Vrst and the floating diffusion region 153, and resets the floating diffusion region 153 when a control pulse is applied to the gate electrode thereof. The amplification transistor has its drain electrode connected to a power supply Vdd, and has its gate electrode connected to the floating diffusion region 153. The select transistor has its drain electrode connected to the source electrode of the amplification transistor, and has its source electrode connected to the corresponding vertical signal line 117.

When a control pulse is applied to the gate electrode of the select transistor, the select transistor selects the unit pixel 120 from which a signal is to be read. When the select transistor selects the unit pixel 120 from which a pixel signal is to be read, the amplification transistor reads and amplifies the pixel signal indicating the voltage of the floating diffusion region 153, and outputs the pixel signal from its source electrode. The select transistor supplies the pixel signal from the amplification transistor to the column processor 113 via the corresponding vertical signal line 117.

The CMOS image sensor 100 including the unit pixels 120 having the above described structure starts exposing all the pixels at once, finishes exposing all the pixels at once, and transfers the charges accumulated in the photodiodes 151 to the memory units 152 shielded from light. In this manner, a global shuttering operation (global exposure) is realized. Through this global shuttering operation, imaging without distortion can be performed, with the exposure time being the same for all the pixels.

<Process of Manufacturing the Unit Pixels>

Figure 4:
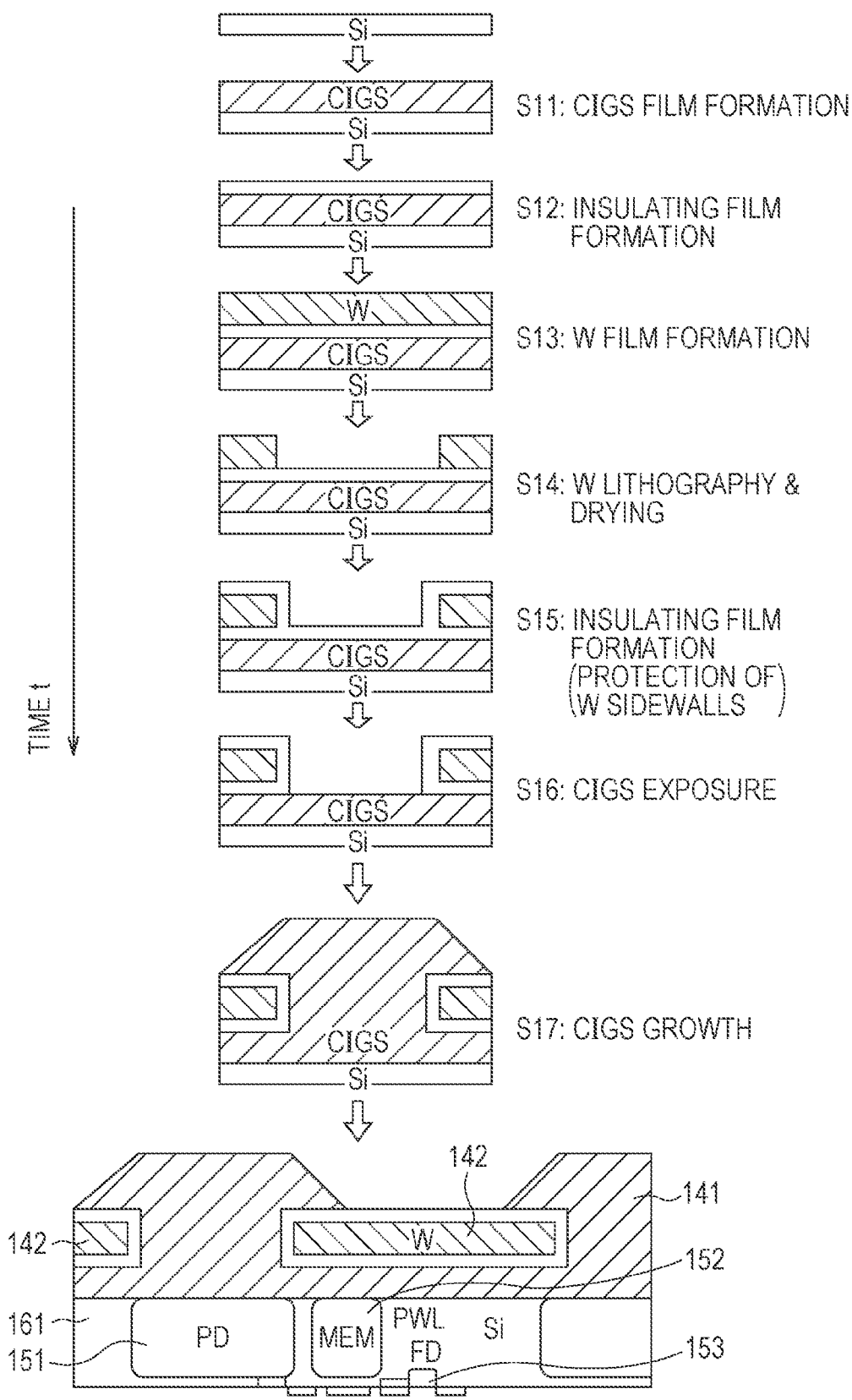
FIG. 4 is a diagram showing a process of manufacturing the unit pixels.

Referring now to FIG. 4, a process of manufacturing the unit pixels 120 is described. FIG. 4 includes cross-sectional views showing an example of a process of manufacturing the unit pixels 120. In FIG. 4, time elapses in the direction from the top toward the bottom of the drawing. In the manufacturing process shown in FIG. 4, CIGS is used as the photoelectric conversion film 141, and tungsten (W) is used as the light shielding films 142.

First, the p-type well layer 161 that is a p-type silicon layer is formed, and a CIGS film is then formed on the entire surface of the silicon layer (Si) by epitaxially growing or sputtering CIGS, for example (S11). An insulating film is further formed on the entire surface of the CIGS film (S12).

Sputtering or the like is then performed to form a tungsten (W) film on the insulating film formed on the entire surface of the CIGS film (S13). Patterning or the like is performed to remove unnecessary portions of the tungsten (W) film (S14). An insulating film is also formed to protect the sidewalls of the tungsten (W) film (S15).

Edging or the like is then performed to remove unnecessary portions of the insulating film and expose the CIGS (S16). The exposed CIGS is epitaxially grown (S17).

In the region where the CIGS is epitaxially grown, the growth direction (the vertical or horizontal direction in the drawing) and the growth rate can be controlled depending on process conditions. The edges of the region where the CIGS is epitaxially grown can be controlled to be almost vertical or be tilted at an angle or be in any other form, depending on process conditions. Furthermore, when the CIGS is epitaxially grown, the growth is stopped before the CIGS reaches the adjacent pixels, so that pixel separation can be performed.

Through the above described manufacturing process, the unit pixels 120 shown in FIG. 2 can be manufactured. In the unit pixels 120 manufactured in this manner, the photoelectric conversion film 141 (such as a CIGS film) having higher light absorptivity than silicon (Si) is used, and the light shielding films 142 are formed (inserted) in the photoelectric conversion film 141, so that the thickness of the photoelectric conversion film 141 can be made smaller. The width of the openings of the unit pixels 120 can be changed to any size depending on the pixel size.

<Other Structures of the Unit Pixels>

Figure 5:
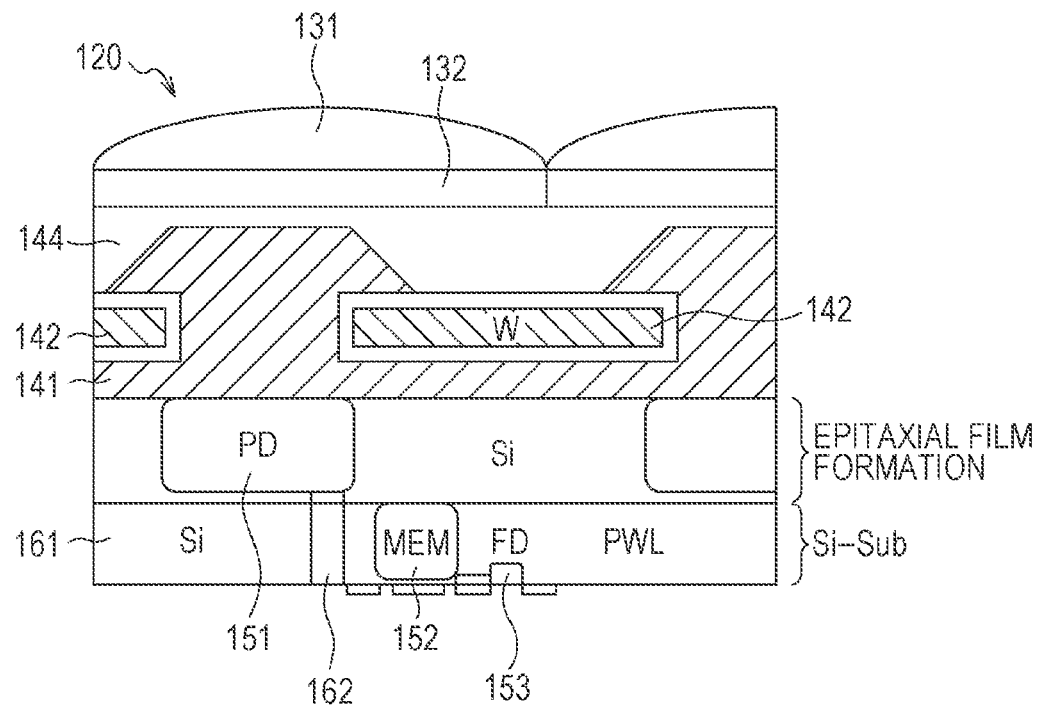
FIG. 5 is a diagram showing another example structure of a unit pixel.
Figure 6:
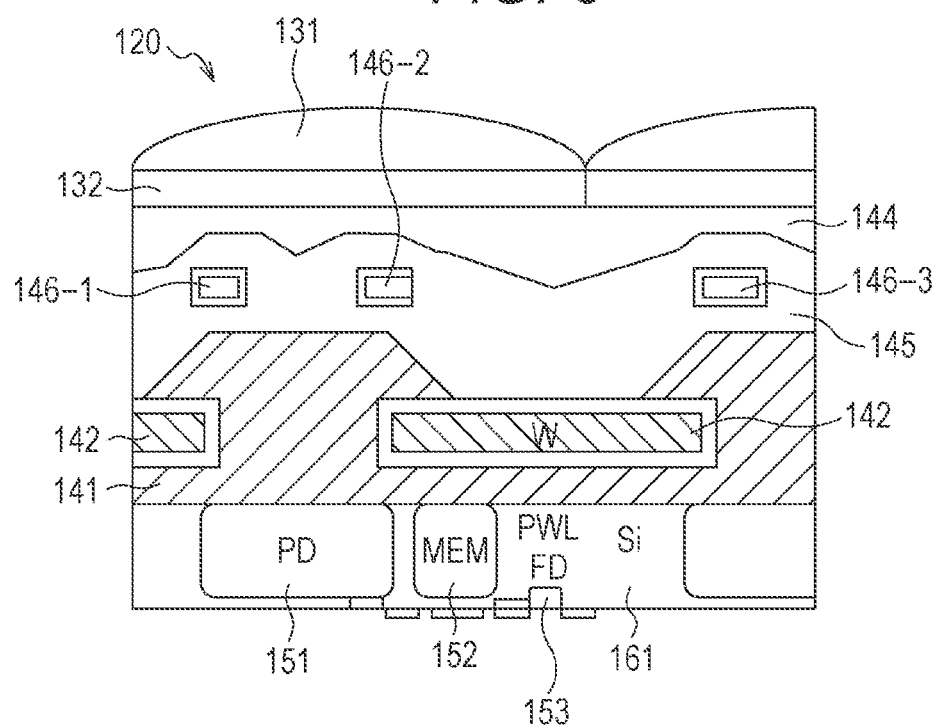
FIG. 6 is a diagram showing another example structure of a unit pixel.

The unit pixels 120 can have a structure that is different from the structure shown in FIG. 2. Referring now to FIGS. 5 and 6, other structures of the unit pixels 120 are described.

FIG. 5 is a diagram showing a structure of the unit pixel 120 in which the photodiode layer and the pixel transistor layer are separated from each other.

In the structure of the unit pixel 120 shown in FIG. 5, the p-type well layer 161 that is a p-type silicon layer is formed, and silicon (Si) is then epitaxially grown, to form the photodiode 151. The silicon is further grown, to form the transfer transistors 162. As a result, the layer of the photodiode 151 and the layer of the transfer transistors 162 can be separated from each other. Through the manufacturing process shown in FIG. 4, the photoelectric conversion film 141 is then formed, and the light shielding film 142 is further formed in the photoelectric conversion film 141.

In a case where the structure shown in FIG. 5 is used, CIGS or the like having a higher photoelectric conversion rate than silicon (Si) is used as the photoelectric conversion film 141, and the light shielding film 142 is buried in the photoelectric conversion film 141. In this manner, the thickness of the photoelectric conversion film 141 can be made smaller, and the memory unit 152 can be located immediately below the light shielding film 142.

FIG. 6 is a diagram showing a unit pixel 120 that includes more light shielding films.

In the structure shown in FIG. 6, the photoelectric conversion film 141 and the light shielding film 142 are formed by the manufacturing process shown in FIG. 4, and a CVD insulating film 145 is then formed. Light shielding films 146-1 through 146-3 are buried at predetermined intervals in the CVD insulating film 145. The planarizing film 144 is formed on the CVD insulating film 145.

In a case where the structure shown in FIG. 6 is used, CIGS or the like having a higher photoelectric conversion rate than silicon (Si) is also used as the photoelectric conversion film 141, and the light shielding film 142 is buried in the photoelectric conversion film 141. Accordingly, the thickness of the photoelectric conversion film 141 can be made smaller, and the memory unit 152 can be located immediately below the light shielding film 142.

Further, the structure shown in FIG. 5 and the structure shown in FIG. 6 may be combined, so that the CVD insulating film 145 having the light shielding films 146 buried therein is formed in the structure having the layer of the photodiode 151 separated from the layer of the pixel transistors.

As described above, according to the present technique, in a structure having the photoelectric conversion film 141 stacked on the semiconductor substrate 123, an inorganic compound semiconductor such as CIGS having a higher photoelectric conversion rate than silicon is used as the photoelectric conversion film 141, and the light shielding films 142 are buried in the photoelectric conversion film 141, so that the thickness of the photoelectric conversion film 141 can be reduced. As a result, the load of the film formation and the processing procedures can be reduced, and incorporation into end products is advantageously facilitated.

Also, according to the present technique, the light shielding films 142 may have shapes corresponding to the openings that depend on the pixel size, instead of invariable shapes. Accordingly, the memory units 152 that store charges transferred from the photodiodes 151 can be located immediately below the light shielding films 142, and be shielded from light. In this manner, the regions under the light shielding films 142 can be effectively used. As light shielding is provided by the light shielding films 142, pixel separation can also be realized.

<Modifications of the Structure of the Solid-State Imaging Element>

Figure 7:
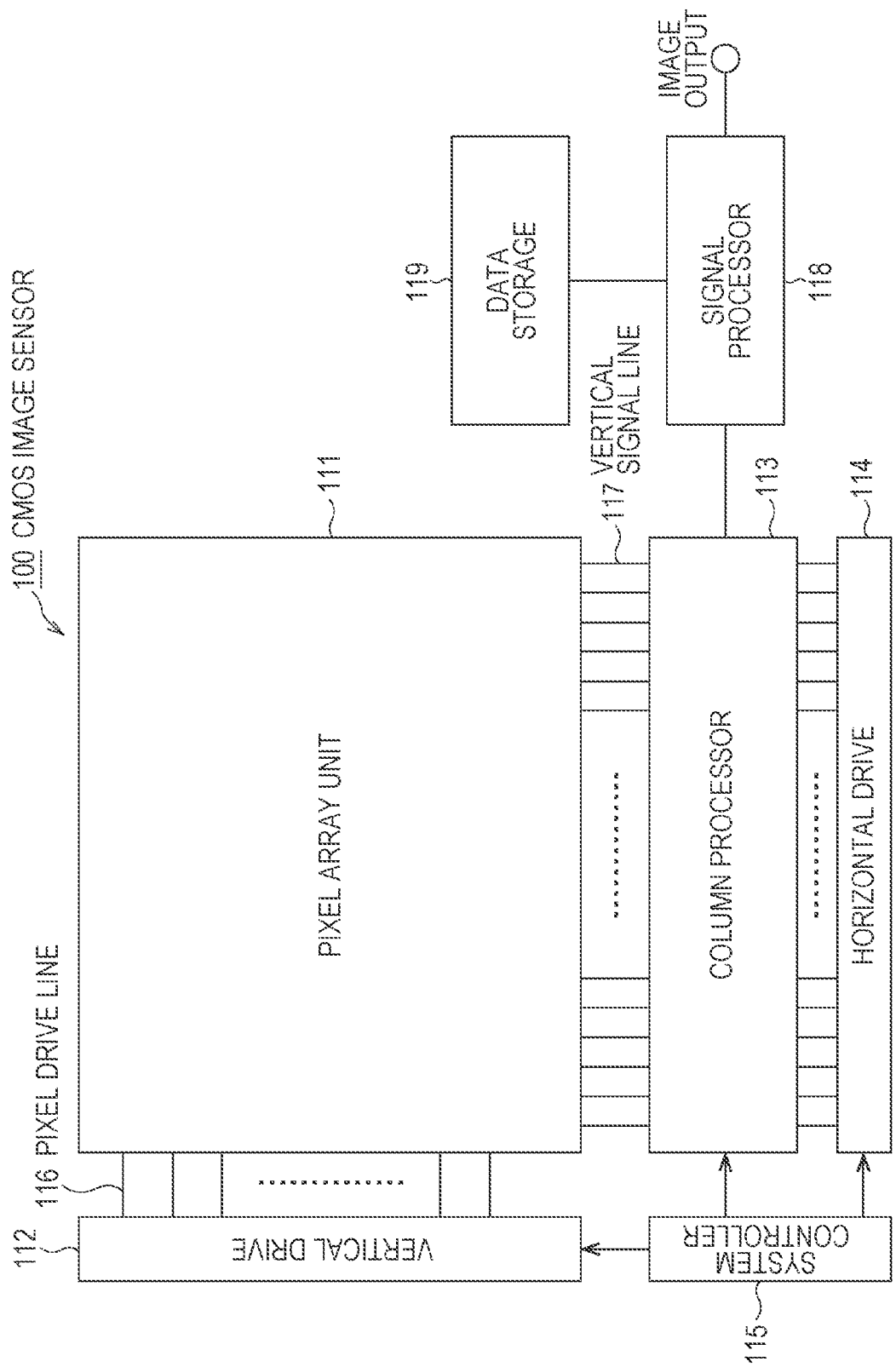
FIG. 7 is a diagram showing another example structure of a CMOS image sensor.

In the above description, as shown in FIG. 1, the data storage 119 and the column processor 113 are placed in parallel with each other with respect to the signal processor 118 in the later stage, but the structure is not limited to that. For example, as shown in FIG. 7, the data storage 119 and the column processor 113 may be placed in parallel with each other, and the signal processor 118 in the later stage may perform signal processing on data that are simultaneously read out by horizontal scanning performed by the horizontal drive 114.

Figure 8:
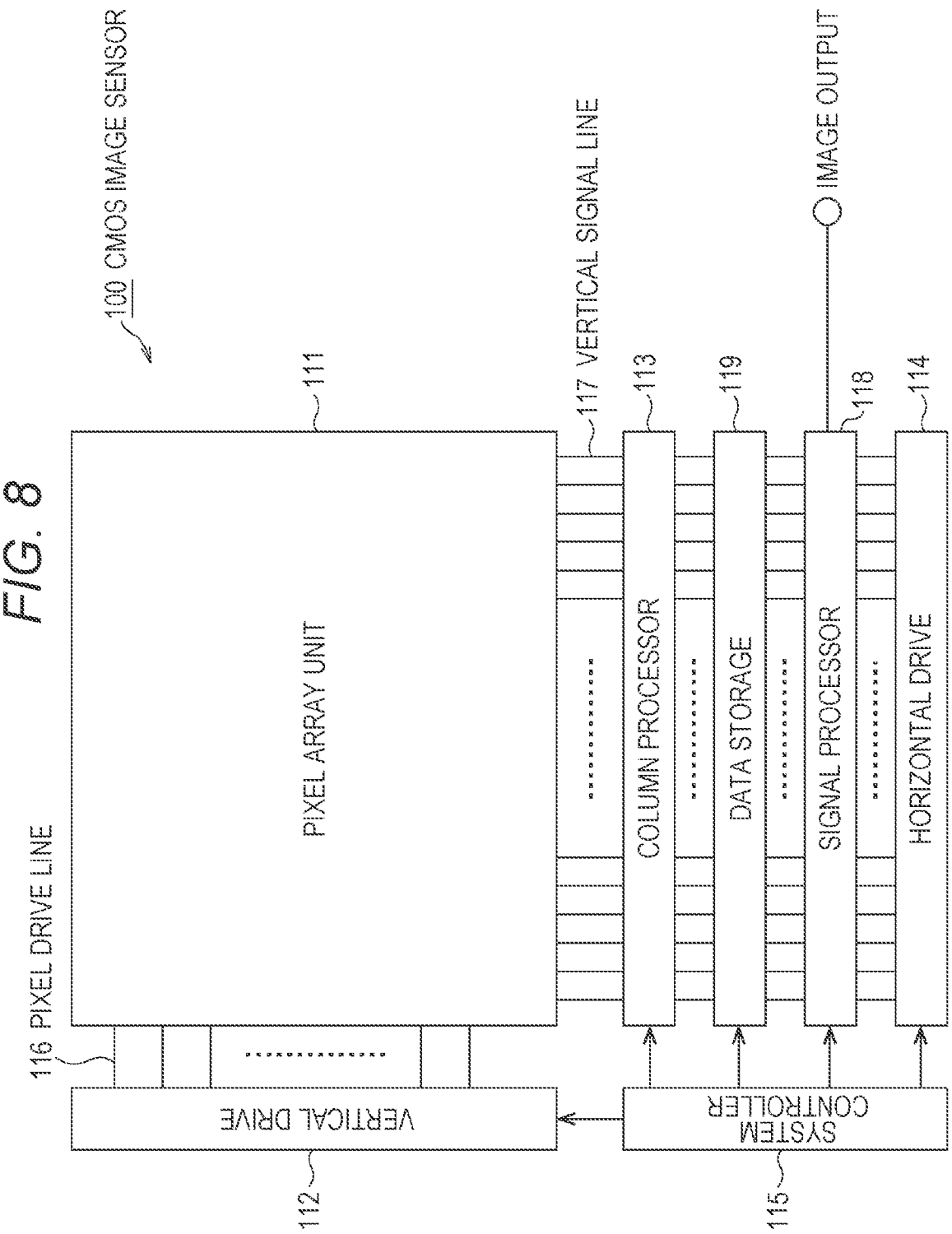
FIG. 8 is a diagram showing another example structure of a CMOS image sensor.

Furthermore, as shown in FIG. 8, the column processor 113 may have an A-D conversion function that performs A-D conversion on each column or each certain number of columns of the pixel array unit 111. Also, the data storage 119 and the signal processor 118 may be placed in parallel with each other with respect to the column processor 113, and perform respective processes on each column or each certain number of columns after the signal processor 118 performs an analog or digital noise removal process.

The present technique is applied not only to solid-state imaging elements. Specifically, the present technique can be applied to any electronic devices that use solid-state imaging elements in the image capturing units (photoelectric converters), such as imaging devices including digital still cameras and digital video cameras, mobile terminals having imaging functions, and copying machines that use solid-state imaging elements in the image reading units. A solid-state imaging element may be formed as one chip, or may be formed as a module in which an imaging unit and a signal processing unit or an optical system are packaged and has an imaging function.

<Example Structure of an Electronic Device to which the Present Technique is Applied>

Figure 9:
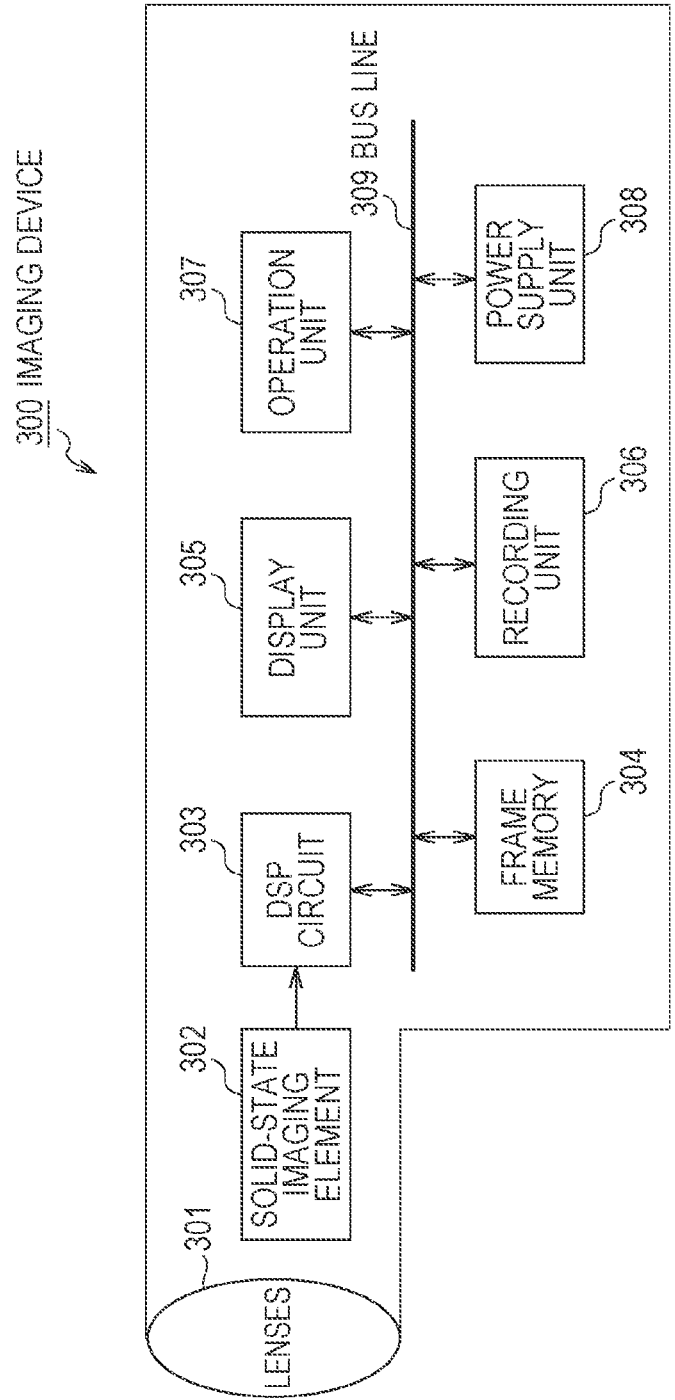
FIG. 9 is a diagram showing an example structure of an imaging device.

FIG. 9 is a diagram showing an example structure of an imaging device as an electronic device to which the present technique is applied.

The imaging device 300 shown in FIG. 9 includes an optical unit 301 formed with lenses and the like, a solid-state imaging element 302 that includes the unit pixels 120 having any of the above described structures, and a DSP (Digital Signal Processor) circuit 303 as a camera signal processor circuit. The imaging device 300 also includes a frame memory 304, a display unit 305, a recording unit 306, an operation unit 307, and a power supply unit 308. The DSP circuit 303, the frame memory 304, the display unit 305, the recording unit 306, the operation unit 307, and the power supply unit 308 are connected to one another via a bus line 309.

The optical unit 301 captures incident light (image light) from the object, and forms an image in the imaging area of the solid-state imaging element 302. The solid-state imaging element 302 converts the light quantity of the incident light, which has been captured as an image in the imaging area by the optical unit 301, into an electric signal for each pixel, and outputs the electric signal as a pixel signal. The solid-state imaging element 302 may be a solid-state imaging element such as the CMOS image sensor 100 according to the above described embodiment, or a solid-state imaging element that can perform imaging without distortion through global exposure.

The display unit 305 is formed with a panel-type display device such as a liquid crystal panel or an organic EL (electro luminescence) panel, and displays a video image or a still image captured and formed by the solid-state imaging element 302. The recording unit 306 records the video image or the still image captured by the solid-state imaging element 302 on a recording medium such as a video tape, a DVD (Digital Versatile Disk), or a flash memory.

In accordance with operations by the user, the operation unit 307 issues operation commands with respect to the various functions of the imaging device 300. The power supply unit 308 serves as various kinds of power supplies for the DSP circuit 303, the frame memory 304, the display unit 305, the recording unit 306, and the operation unit 307, and supplies power to those components where appropriate.

Where the CMOS image sensor 100 according to the above described embodiment is used as the solid-state imaging element 302, a process of reducing noise including kTC noise can be performed, and accordingly, a high S/N ratio can be secured. Thus, the quality of captured images can be improved by the imaging devices 300 not only of digital still cameras and digital video cameras but also of camera modules for mobile devices such as portable telephone devices.

The above described embodiment is applied to a CMOS image sensor in which unit pixels that sense signal charges as a physical quantity corresponding to the light quantity of visible light are arranged in a matrix fashion. However, the present technique is not necessarily applied to a CMOS image sensor, and may be applied to any column-type solid-state imaging element in which column processors are provided for the respective pixel columns of the pixel array unit.

Also, the present technique is not necessarily applied to a solid-state imaging element that senses a distribution of the incident light quantity of visible light and forms an image in accordance with the distribution, but may also be applied to a solid-state imaging element that captures a distribution of an influx of infrared rays, X-rays, particles or the like as an image, or, in a broader sense, to any solid-state imaging element (any physical quantity distribution sensor) such as a finger print sensor that senses a distribution of a physical quantity such as pressure or electrostatic capacitance and captures the distribution as an image.

It should be noted that embodiments of the present technique are not limited to the above described embodiments, and various modifications may be made to them without departing from the scope of the present technique. The present technique can also be embodied in the following structures.

(1) A solid-state imaging element including: a photodiode; and a photoelectric conversion film stacked on a light incident side of the photodiode, a light shielding film being buried in the photoelectric conversion film.

(2) The solid-state imaging element of (1), further including a memory unit that stores charges transferred from the photodiode, and is located immediately below the light shielding film.

(3) The solid-state imaging element of (1) or (2), wherein the light shielding film is formed in accordance with a pixel size.

(4) The solid-state imaging element of (1), wherein the photoelectric conversion film is an inorganic compound semiconductor that can be epitaxially grown.

(5) The solid-state imaging element of (4), wherein the photoelectric conversion film is a CIGS (Copper Indium Gallium DiSelenide) thin film.

(6) A solid-state imaging element manufacturing method including the steps of: forming a photodiode on a semiconductor substrate; and forming a photoelectric conversion film on a light incident side of the semiconductor substrate, a light shielding film being buried in the photoelectric conversion film.

(7) An imaging device including a solid-state imaging element mounted therein, the solid-state imaging element including: a photodiode; and a photoelectric conversion film stacked on a light incident side of the photodiode, a light shielding film being buried in the photoelectric conversion film.

REFERENCE SIGNS LIST

100 CMOS image sensor
111 Pixel array unit
120, 120-1 to 120-4 Unit pixels
121 OCL layer
122 Photoelectric conversion layer
123 Semiconductor substrate
141 Photoelectric conversion film
142, 142-1 to 142-3 Light shielding films
151, 151-1 to 151-4 photodiodes
152, 152-1 to 152-4 Memory units
153, 153-1, 153-2 Floating diffusion regions
300 Imaging device
302 Solid-state imaging element

What is claimed is:

1. A solid-state imaging element, comprising:
a semiconductor substrate;
a photodiode in the semiconductor substrate;
a photoelectric conversion film on a light incident side of the photodiode;
a planarizing film on the photoelectric conversion film; and
a light shielding film at least partially buried within the photoelectric conversion film, wherein
the photoelectric conversion film covers a first portion of the light shielding film, and
the planarizing film covers a second portion of the light shielding film.

2. The solid-state imaging element according to claim 1, further comprising a memory unit configured to store charges transferred from the photodiode, wherein the memory unit is in the semiconductor substrate.

3. The solid-state imaging element according to claim 1, wherein the photoelectric conversion film comprises an inorganic compound semiconductor.

4. The solid-state imaging element according to claim 3, wherein the inorganic compound semiconductor includes Copper Indium Gallium DiSelenide (CIGS).

5. The solid-state imaging element according to claim 1, wherein the photoelectric conversion film comprises at least one of AgInGaSe2, gallium arsenide (GaAs), indium phosphide (In F), iron disulfide (FeS2), copper sulfide (Cu2S), tin sulfide (SnS2), barium silicide (BaSi2), gallium phosphide (Gap), or indium gallium phosphorus (InGaP).

6. The solid-state imaging element according to claim 1, wherein the light shielding film is shared between adjacent pixels.

7. The solid-state imaging element according to claim 1, further comprising a floating diffusion region in the semiconductor substrate.

8. The solid-state imaging element according to claim 7, wherein the first portion of the light shielding film overlaps a portion of the floating diffusion region.

9. The solid-state imaging element according to claim 1, further comprising a signal charge accumulation region in the semiconductor substrate.

10. The solid-state imaging element according to claim 9, wherein the signal charge accumulation region is below the photodiode.

11. The solid-state imaging element according to claim 1, further comprising an insulating film, wherein a portion of the insulating film overlaps the semiconductor substrate.

12. The solid-state imaging element according to claim 1, wherein the first portion of the light shielding film overlaps a portion of the photodiode.

* * * * *